US005968278A

United States Patent [19]

Young et al.

[11] Patent Number: 5,968,278

[45] Date of Patent: Oct. 19, 1999

[54] HIGH ASPECT RATIO CONTACT

[75] Inventors: Bao-Ru Young, I-Lan; Chia-Shiung Tsai; Wen-Chuan Chiang, both of Hsin-Chu, all of Taiwan

[73] Assignee: Taiwan Semiconductor Manufacturing Company Ltd., Hsin-Chu, Taiwan

[21] Appl. No.: 09/206,744

[22] Filed: Dec. 7, 1998

[51] Int. Cl.[6] .................... B08B 6/00

[52] U.S. Cl. .................... 134/1.1; 134/1.2; 216/79; 438/725; 438/723

[58] Field of Search .................... 134/1.1, 1.2; 216/67, 216/79; 438/723, 725, 734

[56] References Cited

U.S. PATENT DOCUMENTS

| | | | |
|---|---|---|---|
| 5,366,590 | 11/1994 | Kadomura | 156/662 |
| 5,429,710 | 7/1995 | Akiba et al. | 216/17 |
| 5,445,712 | 8/1995 | Yahagida | 156/662 |
| 5,658,425 | 8/1997 | Halman et al. | 438/620 |
| 5,783,496 | 7/1998 | Flanner et al. | 438/743 |
| 5,817,579 | 10/1998 | Ko et al. | 438/740 |

FOREIGN PATENT DOCUMENTS

| | | |
|---|---|---|
| 59-117227 | 7/1984 | Japan . |

*Primary Examiner*—Benjamin Utech
*Assistant Examiner*—George Goudreau
*Attorney, Agent, or Firm*—George O. Saile; Stephen B. Ackerman

[57] ABSTRACT

An improved etching procedure that uses three processing steps to vastly improve HAR opening profile and improved under-layer selectivity. A new three sequence etching process is provided during which a new three-gas plasma etch is to be used. This new etching sequence is preceded by a new main etch that uses three gasses and followed by a new over-etch procedure that uses the same three gasses and etching conditions as the new main etch.

34 Claims, 2 Drawing Sheets

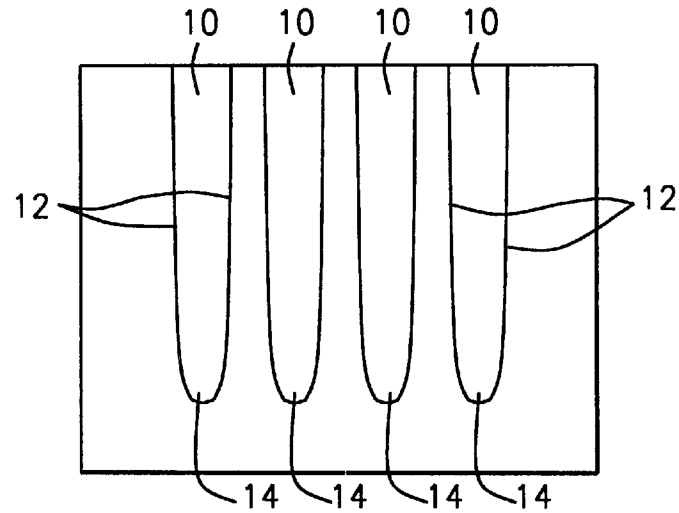
FIG. 1 – Prior Art
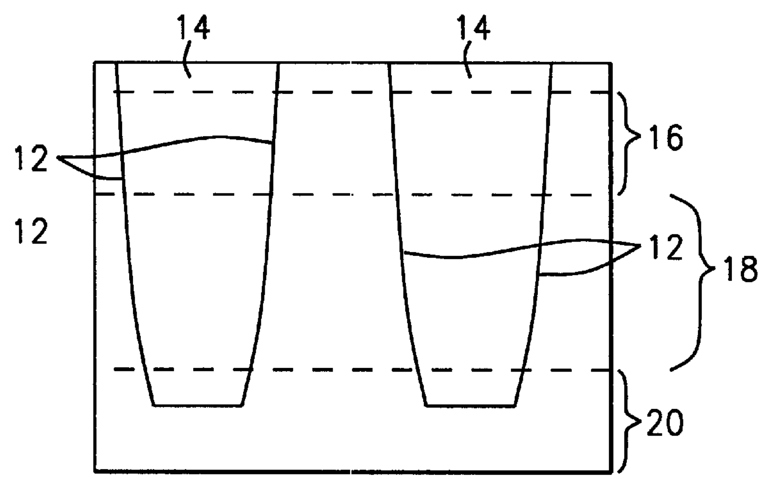
FIG. 2 – Prior Art
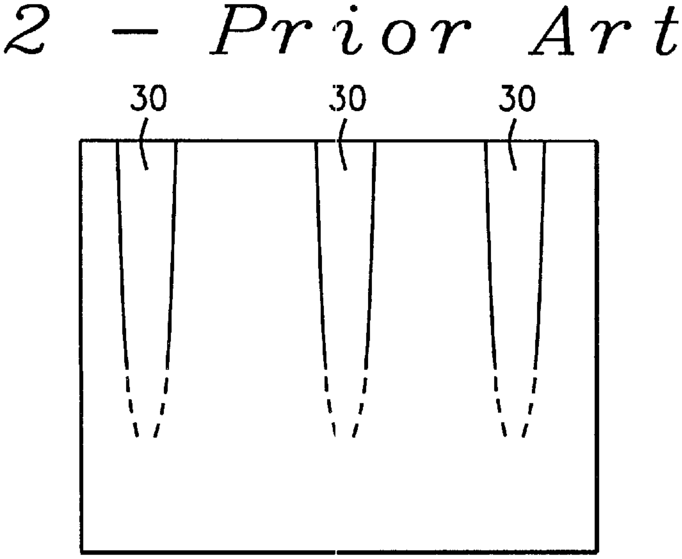
FIG. 3

HIGH ASPECT RATIO CONTACT

BACKGROUND OF THE INVENTION (1) Field of the Invention

The invention relates to the plasma etching of a silicon wafer in the manufacture of integrated circuits.

(2) Description of the Prior Art

As the density of circuit components contained within a semiconductor die has increased and the circuit components have decreased in size and are spaced closer together, it has become increasingly difficult to access selectively a particular region of the silicon wafer through the various layers that are typically superimposed on the surface of the silicon wafer without undesired interference with other active regions.

It is especially important to have a technology that can etch openings that have essentially vertical wall, most notably when the openings are to extend deeply into the surface layers. Additionally, to tolerate some misalignment in the masks used to define such openings, it is advantageous to provide protection to regions that need isolation but that inadvertently lie partially in the path of the projected opening. To this end it is sometimes the practice to surround such regions with a layer of material that resists etching by the process being used to form the openings. Accordingly, a technology that provides the desired results will need an appropriate choice both in the materials used in the layers and the particular etching process used with the materials chosen.

Dry etching, such as plasma etching and reactive ion etching, has become the technology of choice in patterning various layers that are formed over a silicon wafer as it is processed to form therein high density integrated circuit devices. This is because it is a process that not only can be highly selective in the materials it etches, but also highly anisotropic. This makes possible etching with nearly vertical sidewalls.

Basically, in plasma etching as used in the manufacturing of silicon integrated devices, a silicon wafer on whose surface has been deposited various layers, is positioned on a first electrode in a chamber that also includes a second electrode spaced opposite the first. As a gaseous medium that consists of one or more gasses is flowed through the chamber, an r-f voltage, which may include components at different frequencies, is applied between the two electrodes to create a discharge that ionizes the gaseous medium and that forms a plasma that etches the wafer. By appropriate choice of the gasses of the gaseous medium and the parameters of the discharge, selective and anisotropic etching is achieved.

While elaborate theories have been developed to explain the plasma process, in practice most of such processes have been developed largely by experimentation involving trial and error of the relatively poor predictability of results otherwise.

Moreover, because of the number of variables involved and because most etching processes depend critically nor only on the particular materials to be etched but also on the desired selectivity and anisotropy, such experimentation can be time consuming while success often depends on chance.

FIG. 1 shows a Prior Art cross section of etched contact holes that are in this case used for embedded DRAM circuits. The cross section clearly shows the bow type profile problem together with the problem of over-etching into the underlying $T_iS_{ix}$. The presented profile of the contact openings 10 has been obtained using the conventional etching sequence for 0.025 um. embedded DRAM circuits. Six gasses were used for this etching procedure which resulted in bow type contact profile and poor underlayer selectivity. The bow type contact opening profile 12 will lead to poor barrier metal uniformity and underlayer loss will result in junction leakage. The cross section of FIG. 1 clearly illustrates that the sidewalls of the contact openings are bowed in shape while it is visible that over-etching occurred into the underlying TiSix substrate.

FIG. 2 shows an enlargement of the lower part 14 of FIG. 1 that further highlights the indicated problems of non-linear profile of the opening sidewalls together with the over-etching into the TiSix substrate. The layer 16 has been treated with the USG process, the layer 18 has been treated with the BPSG process, layer 20 contains $TiSi_x$.

Borophosphosilicate glass (BPSG) is used for sidewall contouring of the contact holes by reflow. In addition to assuring that the contact holes are opened and that silicon-surface damage and contamination are minimized, it is also important to give the contact holes a shape that will result in good step coverage by the metal that is deposited into it. In general, better step coverage will be obtained if the walls of the openings are sloped and the top corners are rounded. Several different approaches have been pursued to achieve these desired sidewalls profiles. One of the most popular is the reflow of the contact hole dielectric layer. Wafers are exposed to a high temperature step after the holes have been opened. This causes the CVD doped SiO2 layer to flow slightly, producing round corners and sloped sidewalls in the contact holes. BPSG flows at the lowest temperatures (800–850 degrees C. at atmospheric pressure).

Undoped Silicate (USG) is a silicate not doped with boron or phosphorus. The process and use of the USG is similar to the use and process of the BPSG as described above.

The HAR contact etching conditions used in the creation of the profiles as shown in FIG. 1 and FIG. 2. are as follows. Note that a total of six gases are used for this etching procedure, this etching procedure is the Main Etching (ME) procedure of the present or Prior Art etching process.

| | |
|---|---|
| Etching chamber pressure: | 10 Milli Torr |
| Source or top plate power: | 700 Watts |
| Bottom plate power: | 900 Watts |
| Gas composition: | 15 SCCM $C_2F_6$ |
| | 20 SCCM $CH_2F_2$ |
| | 40 SCCM CO |
| | 5 SCCM $C_4F_8$ |
| | 5 SCCM $O_2$ |
| | 100 SCCM Argon. |

Note: SCCM stands for Standard Cubic Centimeter per Minute and as such presents the flow-rate of the gas indicated.

The present invention addresses the Prior Art etching process and the etching sequence and gasses used during this process. The present invention provides for the addition of two etching steps, that is a Main Etch (ME) and a Over Etch (OE), these two steps performed under the same operating conditions of the chamber and using three gasses. ME takes place before the above indicated Prior Art etching step while the OE takes place after this etching step.

U.S. Pat. No. 5,366,590 (Kadomura) U.S. Pat. No. 5,445,712 (Yanagida) U.S. Pat. No. 5,658,425 (Halman et al.) and U.S. Pat. No. 5,783,496 (Flanner et al.) show high aspect contact opening etch processes using fluorocarbons and oxygen containing gasses.

SUMMARY OF THE INVENTION

It is the primary objective of the present invention to improve the contact profile within High Aspect Ratio (HAR) openings etched into semiconductor wafers.

It is another objective of the present invention to reduce leakage current between junctions within semiconductor wafers.

It is yet another objective of the present invention to improve the contact profile of openings etched into semiconductor wafers from a profile with bowed sidewalls to a profile with straight sidewalls.

It is yet another objective of the current invention to improve the underlayer selectivity when etching contact openings into semiconductor wafers.

According to the present invention, a semiconductor wafer etching process is provided whereby the contact profile for holes or openings etched into the semiconductor wafer is improved. Some problems in achieving microscopic uniformity occur because etching rates and profiles depend on feature size and pattern density.

Microscopic uniformity problems can be grouped into two categories, that is aspect ratio dependent etching (ARDE) and pattern dependent etching. The cause of the problem is limited ion and neutral transport within the trench.

Aspect ratio dependent etching shows itself by creating sidewalls within the etched openings that are uneven and that have a profile with graded or non-linear walls. Trenches with a large aspect ratio will also etch more slowly than trenches with a small aspect ratio. Ion scattering results from ion-neutral collisions and electrical charging on the masks causes aspect ratio dependent etching. Some neutrals are transported to the bottom of the trench by diffusion, also contributing to the ARDE. Low gas pressure reduces the ARDE effect while chlorine-based chemistry shows less ARDE than fluorine-based chemistry during deep trench etching, this because ion assisted etching is dominant in chlorine-based chemistry.

This phenomenon became serious when the era of submicrometer etching began in recent years. Ion bombardment, electron bombardment, reactive neutral species, product desorption and redeposition all appear to be important in determining the relative etch rates in trenches. The present invention, while improving the High Aspect Ratio (HAR) contact profile of the etched openings, also prevents underlayer loss when combined with good underlayer selectivity. Underlayer loss will cause problems of junction leakage between the various layers within the semiconductor wafer.

Selectivity is defined as one film etching faster than another film under the same etching conditions. A higher etch rate ratio (ERR) between different layers is the crucial advantage of reactive ion etching over physical sputtering. The etch-rate differences between two different materials are due to different surface-etch mechanisms, such as adsorption, reaction, and desorption. During etching, the selectivities with respect to the masking material and the underlying layer require careful control. The required selectivity is defined according to a special percentage of overetch and film thickness.

Currently, the HAR contact etching for 0.25 um. Embedded DRAM with six gases results in a bow type contact profile and in poor underlayer selectivity. The bow type contact profile results in poor barrier metal uniformity while the underlayer loss causes junction leakage current. The present invention provides an etching sequence using three gasses that improves the contact profile and at the same time increases the underlayer selectivity during the etching process. A three gas etching process however leads to sharply decreased etching or etching stop during the etching process. The present invention therefore provides for a sequence of three processing steps using multiple gas type etching. This sequence using three gasses for two of the three processing steps and lead to the indicated improved contact opening profile and the increased underlayer selectivity.

The results than of the provided etching process is improved contact profile within HAR contact etchings and a reduction of the leakage current between layers of the semiconductor wafer.

BRIEF DESCRIPTION OF THE DRAWINGS

In the accompanying drawings, forming an integral part of the description, there is shown:

FIG. 1 shows a cross section of the bow type profile problem together with the over-etching into the $T_iS_{ix}$ problem.

FIG. 2 shows a cross section of the same problems as shown in FIG. 1 after application of USG and BPSG.

FIG. 3 shows a cross section of the etching stop phenomenon using the three gas etching process.

DETAILED DESCRIPTION OF THE PREFERRED EMBODIMENT

Referring now more specifically to FIG. 3, there is shown a cross section of the contact holes 30 etched into a layer of depositions on top of the substrate. This etching process used a three gas etching sequence and demonstrates that the etching action ceases well before the desired etching results are obtained. This incomplete etching of the contact openings is caused by the polymer rich characteristics of the three gas etching process.

Figure 4:
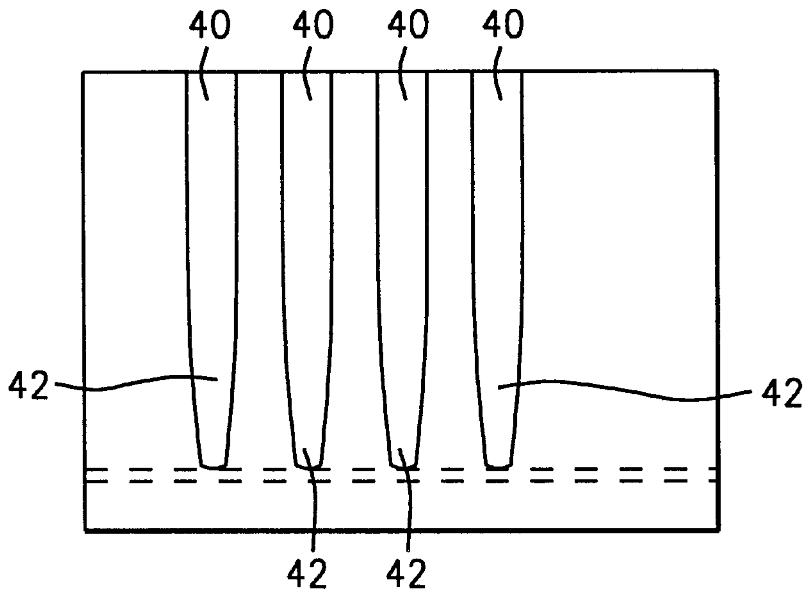
FIG. 4 shows a cross section of an example of sandwich type HAR contact opening etching down to the $T_iS_{ix}$ contact level.

FIG. 4 shows a cross section of the contact holes 40 using the improved HAR contact opening etching of the present invention. This cross-section shows a considerable improvement in the profile of the sidewalls of the contact openings while the over-etch problem has been eliminated.

Figure 5:
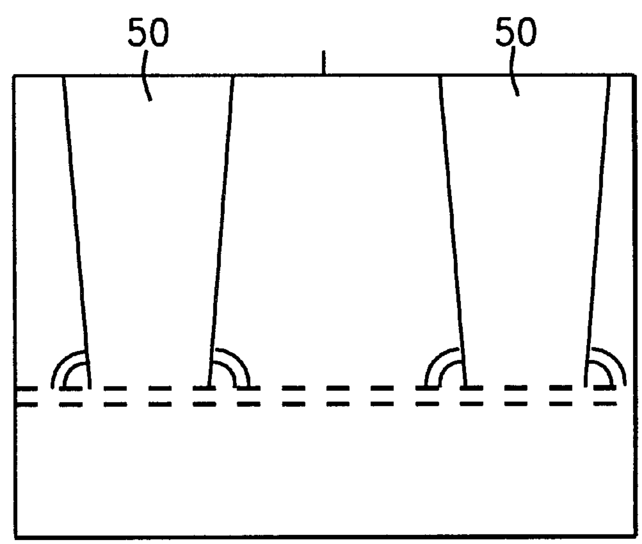
FIG. 5 shows a cross section of the contact level between the contact opening and the underlying $T_iS_{ix}$ in magnified form.

FIG. 5 shows openings 50, an enlarged view of a cross-section of the lower sections 42, FIG. 4. This cross section shows that the problem of over-etching has been eliminated.

The etching process of the present invention uses a sequence of three etching steps, the operating conditions used for these three etching procedures are as follows:

Processing step 1, Main Etch 1 (ME1), this etch uses three gasses and has operating conditions of the plasma process chamber that are different from the Prior Art operating conditions, as follows:

| | |
|---|---|
| Etching chamber pressure: | 3–7 Milli Torr |
| Backside Helium Pressure: | 10–14 Milli Torr |
| Source or top plate power: | 1000–1500 Watts |
| Bottom plate power: | 1500–2000 Watts |
| Gas composition: | 17–23 SCCM $CH_2F_2$ |
| | 25–35 SCCM $C_4F_8$ |
| | 175–225 SCCM CO. |

Processing step 2, Main Etch 2 (ME2), this etching step is the same as the previously indicated Prior Art etching process in both operating conditions applied to the plasma process chamber and in the gasses used for the etching, as follows:

| | |
|---|---|
| Etching chamber pressure: | 7–13 Milli Torr |
| Backside Helium Pressure: | 10–14 Milli Torr |
| Source or top plate power: | 600–800 Watts |
| Bottom plate power: | 750–1050 Watts |
| Gas composition: | 12–18 SCCM $C_2F_6$ |
| | 17–23 SCCM $CH_2$ |
| | 35–45 SCCM CO |
| | 3–7 SCCM $C_4F_8$ |
| | 3–7 SCCM $O_2$ |
| | 75–125 SCCM Argon. |

Processing step 3, Over Etch, this step is the same as the above indicated ME1 in both operating conditions applied to the plasma process chamber and in the gasses used for the etching.

| | |
|---|---|
| Etching chamber pressure: | 3–7 Milli Torr |
| Backside Helium Pressure: | 10–14 Milli Torr |
| Source or top plate power: | 1000–1500 Watts |
| Bottom plate power: | 1500–2000 Watts |
| Gas composition: | 17–23 SCCM $CH_2F_2$ |
| | 25–35 SCCM $C_4F_8$ |
| | 175–225 SCCM $O_2$. |

Etching completion is monitored by assuring that the loss of TiSi does not exceed 200 Angstrom while no bowing is to occur in the etched profile.

In sum: the etching process provided for by the present invention consists of three different and distinct etching procedures, that is a main-etch (ME1) using three gasses is added before the presently existing, Prior Art, main etch. A second main-etch (ME2), identical to the presently existing main etch is performed. An over-etch (OE), identical to the first main etch (ME1) is performed after this.

It can be appreciated that the specific embodiment described is merely illustrative of the basic principles involved and that various modifications can be made hereto by those skilled in the art without departing from the spirit of the present invention. Thus it is apparent that has been provided, in accordance with the present invention, a multi-step etching process.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for removing or etching polymer depositions in a plasma process chamber wherein substrates are processed, comprising the steps of:

performing a first main etch wherein the plasma cleaning gas contains between 17 and 23 SCCM of $CH_2F_2$ with between 25 and 35 SCCM of $C_4F_8$ with between 175 and 225 SCCM of CO;

performing a second main etch wherein the plasma cleaning gas contains between 12 and 18 SCCM of $C_2F_6$ with between 17 and 23 SCCM of $CH_2F_2$ with between 35 and 45 SCCM of CO with between 3 and 7 SCCM of $C_4F_8$ with between 3 and 7 SCCM of $O_2$ with between 75 and 125 SCCM of Argon; and performing an over-etch wherein the plasma cleaning gas contains between 17 and 23 SCCM of $CH_2F_2$ with between 25 and 35 SCCM of $C_4F_8$ with between 175 and 225 SCCM of CO.

2. The method of claim 1 wherein said performing a first main etch is:

positioning the wafer in a plasma reactor that includes a chamber within which there can be created a radio frequency discharge and wherein pressure can be adjusted;

flowing through the chamber a gaseous medium that when subjected to the radio frequency discharge generates a plasma that includes reactive ions;

adjusting the first pressure level within the chamber; adjusting the first power level applied to the top plate in the chamber;

adjusting the first power level applied to the bottom plate in the chamber; and performing a plasma cleaning step by activating the cleaning gas and forming said plasma cleaning gas, contacting the gas distribution plate of the chamber with the plasma cleaning gas for a time sufficient to remove polymer residues from the gas distribution plate.

3. The method of claim 2 wherein the step of adjusting the first pressure level within the chamber consists of setting said pressure to between 3 and 7 Milli Torr.

4. The method of claim 2 wherein the step of adjusting the first power level to the top plate in the chamber consists of applying between 1000 and 1500 Watts to said plate.

5. The method of claim 2 wherein the step of adjusting thirst power level to the bottom plate in the chamber consists of applying between 1500 and 2000 Watts to said plate.

6. The method of claim 2 wherein said removing or etching of polymer depositions uses a low-pressure batch reactive ion etcher (RIE).

7. The method of claim 2 wherein said removing or etching of polymer depositions uses a low-pressure, high density electron cyclotron resonance (ECR) plasma etcher.

8. The method of claim 2 wherein said removing or etching of polymer depositions uses a magnetically enhanced reactive ion etcher.

9. The method of claim 2 wherein said removing or etching of polymer depositions uses a low-pressure, high-density plasma reactor.

10. The method of claim 2 wherein said removing or etching of polymer depositions uses a transformer coupled plasma reactor.

11. The method of claim 2 wherein said removing or etching of polymer depositions uses a low-pressure inductively coupled plasma reactor.

12. The method of claim 2 whereby the backside helium pressure is between 10 and 14 milli Torr.

13. The method of claim 1 wherein said performing said second main etch is:

positioning the wafer in a plasma reactor that includes a chamber within which there can be created a radio frequency discharge and wherein pressure can be adjusted;

flowing through the chamber a gaseous medium that when subjected to the radio frequency discharge generates a plasma that includes reactive ions;

adjusting the second pressure level within the chamber; adjusting the second power level applied to the top plate in the chamber;

adjusting the second power level applied to the bottom plate in the chamber; and performing a plasma cleaning step by activating the cleaning gas and forming said plasma cleaning gas, contacting the inner surface of the semiconductor contact holes with the plasma cleaning gas for a time sufficient to partially remove polymer residues on the inner surface of the semiconductor contact holes.

14. The method of claim 13 wherein the step of adjusting the second pressure level within the chamber consists of setting said pressure to between 7 and 13 Milli Torr.

15. The method of claim 13 wherein the step of adjusting the second power level to the top plate in the chamber consists of applying between 600 and 800 Watts to said plate.

16. The method of claim 13 wherein the step of adjusting the second power level to the bottom plate in the chamber consists of applying between 750 and 1050 Watts to said plate.

17. The method of claim 13 wherein said removing or etching of polymer depositions uses a low-pressure batch reactive ion etcher (RIE).

18. The method of claim 13 wherein said removing or etching of polymer depositions uses a low-pressure, high density electron cyclotron resonance (ECR) plasma etcher.

19. The method of claim 13 wherein said removing or etching of polymer depositions uses a magnetically enhanced reactive ion etcher.

20. The method of claim 13 wherein said removing or etching of polymer depositions uses a low-pressure, high-density plasma reactor.

21. The method of claim 13 wherein said removing or etching of polymer depositions uses a transformer coupled plasma reactor.

22. The method of claim 13 wherein said removing or etching of polymer depositions uses a low-pressure inductively coupled plasma reactor.

23. The method of claim 13 whereby the backside helium pressure is between 10 and 14 milli Torr.

24. The method of claim 1 wherein said performing an over-etch is:

positioning the wafer in a plasma reactor that includes a chamber within which there can be created a radio frequency discharge and wherein pressure can be adjusted;

flowing through the chamber a gaseous medium that when subjected to the radio frequency discharge generates a plasma that includes reactive ions;

adjusting the third pressure level within the chamber;

adjusting the third power level applied to the top plate in the chamber;

adjusting the third power level applied to the bottom plate in the chamber; and performing a plasma cleaning step by activating the cleaning gas and forming said plasma cleaning gas, contacting the inner surface of the semiconductor contact holes with the plasma cleaning gas for a time sufficient to completely remove polymer residues on the inner surface of the semiconductor contact holes.

25. The method of claim 24 wherein the step of adjusting the third pressure level within the chamber consists of setting said pressure to between 5 and 7 Milli Torr.

26. The method of claim 24 wherein the step of adjusting the third power level to the top plate in the chamber consists of applying between 1000 and 1500 Watts to said plate.

27. The method of claim 24 wherein the step of adjusting the third power level to the bottom plate in the chamber consists of applying between 1500 and 2000 Watts to said plate.

28. The method of claim 24 wherein said removing or etching of polymer depositions uses a low-pressure batch reactive ion etcher (RIE).

29. The method of claim 24 wherein said removing or etching of polymer depositions uses a low-pressure, high density electron cyclotron resonance (ECR) plasma etcher.

30. The method of claim 24 wherein said removing or etching of polymer depositions uses a magnetically enhanced reactive ion etcher.

31. The method of claim 24 wherein said removing or etching of polymer depositions uses a low-pressure, high-density plasma reactor.

32. The method of claim 24 wherein said removing or etching of polymer depositions uses a transformer coupled plasma reactor.

33. The method of claim 24 wherein said removing or etching of polymer depositions uses a low-pressure inductively coupled plasma reactor.

34. The method of claim 24 whereby the backside helium pressure is between 10 and 14 milli Torr.

* * * * *